(12) United States Patent
Shi et al.

(10) Patent No.: US 11,757,456 B2
(45) Date of Patent: Sep. 12, 2023

(54) PHASE-LOCKED LOOP CIRCUIT AND DIGITAL OPERATION SYSTEM

(71) Applicant: Weifang Goertek Microelectronics Co. Ltd., Shandong (CN)

(72) Inventors: Mingyong Shi, Shandong (CN); Zhiyou Xu, Shandong (CN); Lide Wu, Shandong (CN)

(73) Assignee: Weifang Goertek Microelectronics Co., Ltd., Shandong (CN)

( * ) Notice: Subject to any disclaimer, the term of this patent is extended or adjusted under 35 U.S.C. 154(b) by 27 days.

(21) Appl. No.: 17/607,510

(22) PCT Filed: Dec. 30, 2019

(86) PCT No.: PCT/CN2019/130093
§ 371 (c)(1),
(2) Date: Oct. 29, 2021

(87) PCT Pub. No.: WO2020/220714
PCT Pub. Date: Nov. 5, 2020

(65) Prior Publication Data
US 2022/0231693 A1    Jul. 21, 2022

(30) Foreign Application Priority Data
Apr. 29, 2019  (CN) .......................... 201910356542.5

(51) Int. Cl.
*H03L 7/095* (2006.01)
*H03L 7/089* (2006.01)
(Continued)

(52) U.S. Cl.
CPC ............ *H03L 7/095* (2013.01); *H03L 7/0891* (2013.01); *H03L 7/093* (2013.01); *H03L 7/0992* (2013.01)

(58) Field of Classification Search
CPC ....... H03L 7/095; H03L 7/0891; H03L 7/093; H03L 7/0992
See application file for complete search history.

(56) References Cited

U.S. PATENT DOCUMENTS 6,504,799 B1 * 1/2003 Yamashita ........... G11B 7/0941
6,794,944 B2 * 9/2004 Hirai ..................... H03L 7/0891
331/17

(Continued)

FOREIGN PATENT DOCUMENTS

| CN | 1801622 A | 7/2006 |
| CN | 101621297 B | 12/2012 |

(Continued)

*Primary Examiner* — Adam D Houston
(74) *Attorney, Agent, or Firm* — Baker Botts LLP

(57) ABSTRACT

Disclosed is a phase-locked loop circuit, including: a phase-locked loop, a locking detection circuit, an input end for inputting a reference clock signal, a first output end for outputting an oscillator clock signal, and a second output end for outputting a locking signal, wherein the phase-locked loop is configured to output the oscillator clock signal according to the reference clock signal and control the reference clock signal and the oscillator clock signal to be synchronous; and the locking detection circuit is configured to output the locking signal to the second output end when the oscillator clock signal and the reference clock signal are synchronous.

7 Claims, 2 Drawing Sheets

(51) Int. Cl.
*H03L 7/093* (2006.01)
*H03L 7/099* (2006.01)

(56) References Cited

U.S. PATENT DOCUMENTS

| | | | | |
|---|---|---|---|---|
| 9,258,000 | B1* | 2/2016 | Kordik | H03L 7/095 |
| 2009/0251226 | A1* | 10/2009 | Kathuria | H03L 7/095 |
| | | | | 331/1 R |
| 2013/0120035 | A1* | 5/2013 | Kuo | H03L 7/095 |
| | | | | 327/156 |
| 2019/0268006 | A1* | 8/2019 | Hiraku | H03L 7/1075 |

FOREIGN PATENT DOCUMENTS

| | | | | |
|---|---|---|---|---|
| CN | 103187911 A | | 7/2013 | |
| CN | 110166047 A | * | 8/2019 | H03L 7/0891 |
| CN | 110166047 A | | 8/2019 | |
| EP | 1249936 A2 | * | 10/2002 | H03L 7/0891 |
| JP | 2013223075 A | * | 10/2013 | |

* cited by examiner

PHASE-LOCKED LOOP CIRCUIT AND DIGITAL OPERATION SYSTEM

CROSS-REFERENCE TO RELATED APPLICATIONS

This application is a National Stage of International Application No. PCT/CN2019/130093, filed on Dec. 30, 2019, which claims priority to Chinese Patent Application No. 201910356542.5, filed on Apr. 29, 2019, both of which are hereby incorporated by reference in its entirety.

TECHNICAL FIELD

The present disclosure relates to the technical field of circuit design, in particular to a phase-locked loop circuit and a digital operation system.

BACKGROUND

In a digital operation system, a phase-locked loop is typically used to generate a high-frequency clock signal for a digital processing circuit in the digital operation system to use.

The phase-locked loop is a typical feedback control circuit, which uses the externally output reference clock signal to control the frequency and the phase of the oscillator clock signal in the loop so as to realize that the frequency of the output oscillator clock signal automatically tracks the input reference clock signal frequency, and is generally applied to a closed-loop tracking circuit.

However, an existing phase-locked loop requires hundreds of microseconds, up to a few milliseconds, to generate an accurate and stable oscillator clock signal. If the digital processing circuit in the digital operation system adopts an unstable oscillator clock signal, the accuracy of the processing result of the digital operation system will be negatively affected.

Therefore, it is of great value to propose a solution which can generate a locking signal to inform the digital operation system when the phase-locked loop outputs a stable oscillator clock signal.

SUMMARY

One objective of an embodiment of the present disclosure is to provide a technical solution which can generate a locking signal when a phase-locked loop outputs a stable oscillator clock signal.

According to a first aspect of the present disclosure, a phase-locked loop circuit is provided and includes a phase-locked loop, a locking detection circuit, an input end for inputting a reference clock signal, a first output end for outputting an oscillator clock signal, and a second output end for outputting a locking signal, wherein the phase-locked loop is configured to output the oscillator clock signal according to the reference clock signal and control the reference clock signal and the oscillator clock signal to be synchronous; and the locking detection circuit is configured to output the locking signal to the second output end when the oscillator clock signal and the reference clock signal are synchronous.

Optionally, the phase-locked loop is a charge pump phase-locked loop.

Optionally, the phase-locked loop includes a phase detector, a charge pump, a loop filter, a voltage-controlled oscillator and a feedback circuit;

the feedback loop is configured to perform frequency modulation processing on the oscillator clock signal to obtain a feedback clock signal, so that a frequency of the feedback clock signal is identical to a frequency of the reference clock signal;

the phase detector is configured to output a first logic level signal and a second logic level signal according to a phase difference between the reference clock signal and the feedback clock signal; the charge pump is configured to convert the first logic level signal and the second logic level signal into current signals;

the loop filter is configured to convert the current signals into voltage signals; and the voltage-controlled oscillator is configured to output an oscillator clock signal with a corresponding frequency according to the voltage signals.

Optionally, the locking detection circuit is configured to determine whether the oscillator clock signal and the reference clock signal are synchronous according to the reference clock signal, the first logic level signal, the second logic level signal and the oscillator clock signal, and output the locking signal in the case that the oscillator clock signal and the reference clock signal are synchronous.

Optionally, the locking detection circuit comprises a first counter, a second counter and an output module; the first counter is configured to count the pulse number of the oscillator clock signal as a first number in the case that the first logic level signal is valid within one period of the reference clock signal; the second counter is configured to count the pulse number of the oscillator clock signal as a second number in the case that the second logic level signal is valid within one period of the reference clock signal; and the output module is configured to output the locking signal in the case that the sum of the first number and the second number is less than or equal to a preset setting value.

Optionally, the output module is further configured to output the locking signal in the case that the sum of the first number and the second number is less than or equal to the setting value within a continuous set number of periods of the reference clock signal.

Optionally, the output module comprises an adder and a comparator; the adder is configured to calculate the sum of the first number and the second number; and the comparator is configured to compare the sum of the first number and the second number with the setting value and output the locking signal according to the comparison result.

Optionally, the locking detection circuit further comprises a rising edge pulse generator; the rising edge pulse generator is configured to output a rising edge pulse to a reset end of the first counter and a reset end of the second counter according to the frequency of the reference clock signal, so that the first counter counts the first number within each period and the second counter counts the second number within each period.

Optionally, the first logic level signal is configured to be input to an enabling end of the first counter, and the second logic level signal is configured to be input to an enabling end of the second counter.

According to a second aspect of the present disclosure, a digital operation system is provided and includes the phase-locked loop circuit according to the first aspect of the present disclosure, and a digital processing circuit, wherein the digital processing circuit is configured to perform digital signal processing according to the oscillator clock signal output by a first output end of the phase-locked loop circuit in the case that the locking signal is output at a second output end of the phase-locked loop circuit.

One beneficial effect of the present disclosure is that in the embodiments of the present disclosure, by setting the locking detection circuit in the phase-locked loop circuit, the locking signal is output in the case that the phase-locked loop detects that the oscillator clock signal and the reference clock signal are synchronous when generating the oscillator signal according to the externally output reference clock signal. In this way, for the digital operation system which performs digital signal processing by the oscillator clock signal, digital signal processing may be performed by the oscillator clock signal in the case that the phase-locked loop circuit outputs the locking signal, so that the accuracy of digital signal processing can be improved.

Other features and advantages of the present disclosure will become apparent from the detailed description for exemplary embodiments of the present disclosure with reference to the following accompany drawings.

BRIEF DESCRIPTION OF THE DRAWINGS

The accompanying drawings, which are combined in the specification and constitute a part of the specification, describe the embodiments of the present disclosure and, together with the specification, serve to explain the principles of the present disclosure.

DETAILED DESCRIPTION OF EMBODIMENTS

Figure 1:
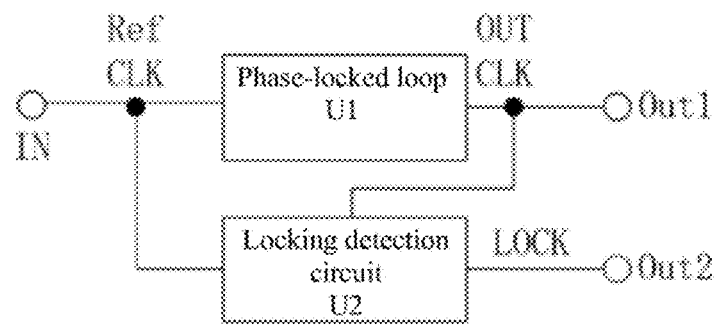
FIG. 1 is a schematic principle block diagram of an example of a phase-locked loop circuit according to an embodiment of the present disclosure.

Various exemplary embodiments of the present disclosure are described in detail hereinafter with reference to the accompanying drawings. It should be noted that unless otherwise specified, relative arrangement, numerical expressions and values of parts and steps described in the embodiments do not limit the scope of the present disclosure.

The following description of the at least one exemplary embodiment is actually merely illustrative and never constitutes any limitation to the present disclosure and application or use thereof.

Technologies, methods and equipment known to those of ordinary skill in the related field may not be discussed in detail, but, where appropriate, the technologies, methods and equipment should be regarded as a part of the specification.

In all the examples shown and discussed herein, any specific value should be interpreted as merely exemplary rather than a limitation. Therefore, other examples of the exemplary embodiments may have different values.

It should be noted that similar reference numerals and letters represent similar items in the accompanying drawings below. Therefore, once an item is defined in one drawing, it is unnecessary to further discuss the item in the subsequent drawings.

<Phase-Locked Loop Circuit>

FIG. 1 is a schematic principle block diagram of an example of a phase-locked loop circuit according to an embodiment of the present disclosure.

As shown in FIG. 1, the phase-locked loop circuit includes a phase-locked loop U1, a locking detection circuit 132, an input end IN for inputting a reference clock signal Ref CLK, a first output end Out 1 for outputting an oscillator clock signal OUT CLK, and a second output end Out 2 for outputting a locking signal LOCK.

The phase-locked loop U1 is configured to output the oscillator clock signal OUT CLK according to the reference clock signal Ref CLK and control the reference clock signal Ref CLK and the oscillator clock signal OUT CLK to be synchronous.

The phase-locked loop U1 in this embodiment is a phase-locked loop. The phase-locked loop is a typical feedback control circuit, which uses the externally output reference clock signal to control the frequency and the phase of the oscillator clock signal generated in the loop so as to realize that the frequency of the output oscillator clock signal automatically tracks the input reference clock signal frequency, and is generally applied to a closed-loop tracking circuit.

The locking detection circuit U2 is configured to output the locking signal LOCK to the second output end Out 2 in the case that the reference clock signal Ref CLK and the oscillator clock signal OUT CLK are synchronous.

That the reference clock signal Ref CLK and the oscillator clock signal OUT CLK are synchronous may be specifically that the frequency of the oscillator clock signal OUT CLK is stable and a phase difference between the reference clock signal Ref CLK and the oscillator clock signal OUT CLK is a fixed value.

In the embodiment, by setting the locking detection circuit in the phase-locked loop circuit, the locking signal is output in the case that the phase-locked loop detects that the oscillator clock signal and the reference clock signal are synchronous when generating the oscillator signal according to the externally output reference clock signal. In this way, for the digital operation system which performs digital signal processing by the oscillator clock signal, digital signal processing may be performed by the oscillator clock signal in the case that the phase-locked loop circuit outputs the locking signal, so that the accuracy of digital signal processing can be improved.

In one embodiment, the phase-locked loop U1 is a charge pump phase-locked loop. The charge pump phase-locked loop is a digital-analog hybrid loop.

In this example, the phase-locked loop U1 may include a phase detector U11, a charge pump U12, a loop filter U13, a voltage-controlled oscillator U14 and a feedback loop U15.

The feedback loop U15 is configured to perform frequency modulation processing on the oscillator clock signal OUT CLK according to a set multiple to acquire a feedback clock signal FB CLK.

In this embodiment, the frequency modulation processing multiple of the feedback loop U15 may be fixed, and may be set in advance according to the frequency of the oscillator clock signal OUT CLK expected to be output by the phase-locked loop U1 and the frequency of the reference clock signal Ref CLK. The multiple may be a ratio of the frequency of the reference clock signal Ref CLK to the frequency of the oscillator clock signal OUT CLK expected to be output by the phase-locked loop U1.

For example, in the case that the frequency of the reference clock signal Ref CLK is 1 Hz and the frequency of the oscillator clock signal OUT CLK expected to be output by the phase-locked loop U1 is 100 Hz, the feedback loop U15 may perform 1/100 multiple frequency modulation processing on the oscillator clock signal OUT CLK. When the phase-locked loop U1 does not generate a stable oscillator clock signal OUT CLK, the frequency of the feedback clock signal FB CLK output by the feedback loop U15 may be different from the frequency of the reference clock signal Ref CLK.

Specifically, when the frequency of the stable oscillator clock signal OUT CL is higher than that of the reference clock signal Ref CLK, the feedback loop U15 may perform frequency division processing on the oscillator clock signal OUT CLK to acquire the feedback clock signal FB CLK. When the frequency of the stable oscillator clock signal OUT CL is lower than that of the reference clock signal Ref CLK, the feedback loop U15 may perform frequency multiplication processing on the oscillator clock signal OUT CLK to acquire the feedback clock signal FB CLK. When the frequency of the stable oscillator clock signal OUT CL is equal to that of the reference clock signal Ref CLK, the feedback loop U15 may directly take the oscillator clock signal OUT CLK as the feedback clock signal FB CLK without performing frequency modulation processing on the oscillator clock signal OUT CLK.

The phase detector U11 is configured to output a first logic level signal UP and a second logic level signal DN according to a phase difference between the reference clock signal Ref CLK and the feedback clock signal FB CLK. Specifically, the phase detector U11 may output the first logic level signal UP through a U end and output the second logic level signal DN through a D end.

In this embodiment, the phase detector U11 may be a phase frequency detector. The phase detector U11 is usually driven by rising edges of the reference lock signal Ref CLK and the feedback clock signal FB CLK.

Figure 3:
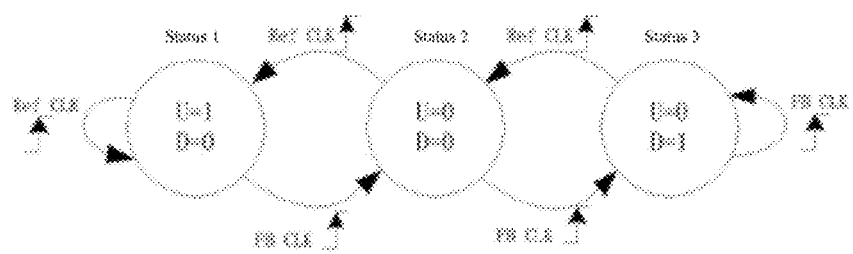
FIG. 3 is a schematic diagram of a working status of a phase detector.

As shown in FIG. 3, the first logic level signal UP and the second logic level signal DN output by the phase detector U11 may form three statuses, including: the first logic level signal UP is at a high level and the second logic level signal DN is at a low level (that is, a status 1); the first logic level signal UP and the second logic level signal DN are both at a low level (that is, a status 2); and the first logic level signal UP is at a low level and the second logic signal DN is at a high level (that is, a status 3).

When a rising edge occurs in the reference clock signal Ref CLK, three events may occur:

1. The first logic level signal UP and the second logic level signal DN output by the phase detector U11 will be converted from the status 3 to the status 2, and the second logic level signal DN is changed into the low level.

2. The first logic level signal UP and the second logic level signal DN output by the phase detector U11 will be converted from the status 2 to the status 1, and the first logic level signal UP is changed into the high level.

3. The statuses of the first logic level signal UP and the second logic level signal DN output by the phase detector U11 will not be changed. At this time, it indicates that the first logic level signal UP has acted.

When a rising edge occurs in the feedback clock signal FB CLK, three events may occur:

1. The first logic level signal UP and the second logic level signal DN output by the phase detector U11 will be converted from the status 1 to the status 2, and the first logic level signal UP is changed into the low level.

2. The first logic level signal UP and the second logic level signal DN output by the phase detector U11 will be converted from the status 2 to the status 3, and the second logic level signal DN is changed into the high level.

3. The statuses of the first logic level signal UP and the second logic level signal DN output by the phase detector U11 will not be changed. At this time, it indicates that the second logic level signal DN has acted.

If the first logic level signal UP and the second logic level signal DN are respectively used to increase and reduce the frequency of the feedback clock signal FB CLK, the phase detector U11 may generate a correct first logic level signal UP and second logic level signal DN to balance a frequency difference between the feedback clock signal FB CLK and the reference clock signal Ref CLK.

The charge pump U12 is configured to convert the first logic level signal UP and the second logic level signal DN into current signals.

When the first logic level signal UP is at the high level and the second logic level signal DN is at the low level, pulse output by the U end enables the charge pump U12 to charge the loop filter U13.

When the first logic level signal UP is at the low level and the second logic level signal DN is at the high level, pulse output by the D end enables the charge pump U12 to discharge the loop filter U13.

When the first logic level signal UP and the second logic level signal DN are both at the low level, the loop filter U13 is neither charged nor discharged.

The loop filter U13 is configured to convert a current signal into a voltage signal.

The loop filter U13 in this embodiment may be a low-pass filter, and may have a first-order, second-order or higher-order filter circuit structure.

The voltage-controlled oscillator U14 is configured to output an oscillator clock signal OUT CLK with a corresponding frequency according the voltage signal.

The voltage-controlled oscillator U14 refers to an oscillator in which the frequency of the output oscillator clock signal output by the oscillating circuit has a corresponding relationship with the input voltage signal, and the frequency of the oscillator clock signal is a function of the input voltage signal. The working status of the voltage-controlled oscillator U14 or a component parameter of the oscillating loop is controlled by the input voltage signal.

In one embodiment, the locking detection circuit U2 is configured to determine whether the reference clock signal Ref CLK and the oscillator clock signal OUT CLK are synchronous according to the reference clock signal Ref CLK, the first logic level signal Up, the second logic level signal DN and the oscillator clock signal OUT CLK, and output the locking signal LOCK in the case that the reference clock signal Ref CLK and the oscillator clock signal OUT CLK are synchronous.

Figure 2:
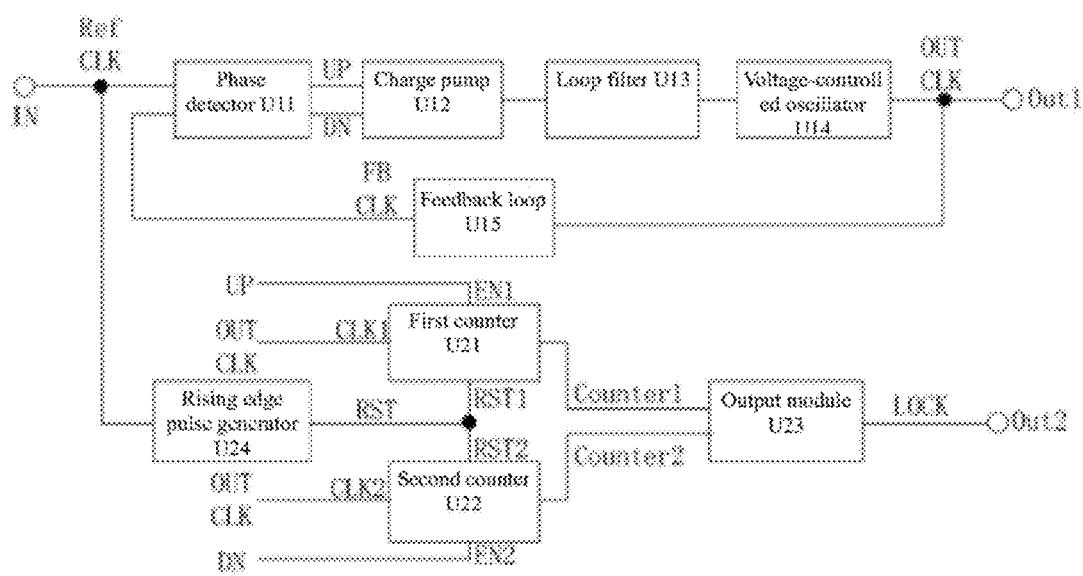
FIG. 2 is a schematic principle block diagram of another example of a phase-locked loop circuit according to an embodiment of the present disclosure.

In this embodiment, as shown in FIG. 2, the locking detection circuit U2 may include a first counter U21, a second counter U22 and an output module U23.

The first counter U21 is configured to count the pulse number of the oscillator clock signal OUT CLK as a first number Counter 1 in the case that the first logic level signal UP is valid within one period of the reference clock signal Ref CLK.

Specifically, in this embodiment, that the first logic level signal Up is valid may mean that the first logic level signal UP is at the high level.

The second counter U22 is configured to count the pulse number of the oscillator clock signal OUT CLK as a second number Counter 2 in the case that the second logic level signal DN is valid within on period of the reference clock signal Ref CLK.

Specifically, in this embodiment, the second logic level signal DN may mean that the second logic levels signal DN is at the high level.

The output module U23 is configured to output a locking signal LOCK in the case that the sum of the first number Counter 1 and the second number Counter 2 is less than or equal to a preset setting value.

In this embodiment, the setting value may be set in advance according to the circuit situation. For example, the setting value may be 2, then the output module U23 may output the locking signal LOCK in the case that the sum of the first number Counter 1 and the second number Counter 2 is less than or equal to 2.

Figure 4:
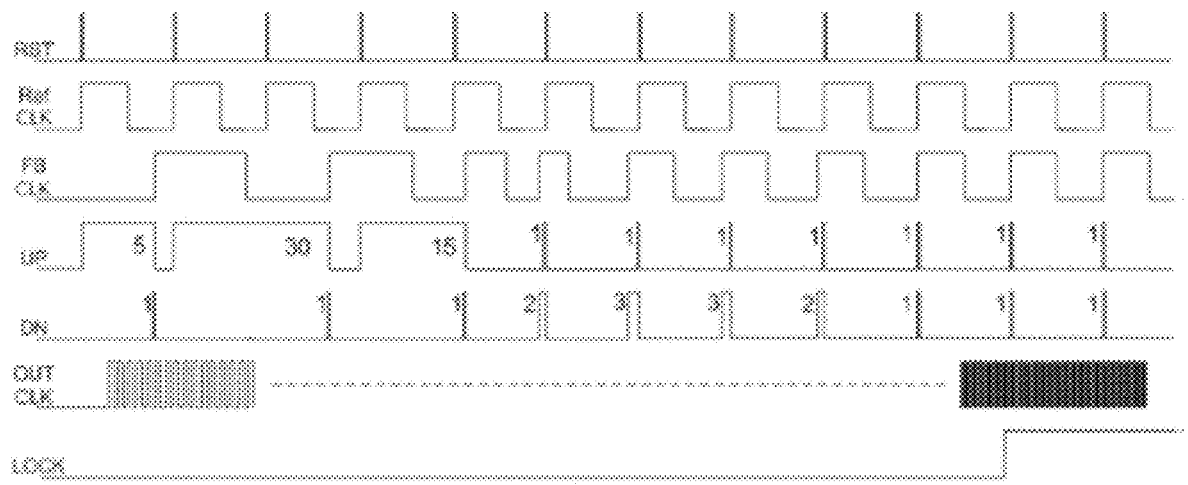
FIG. 4 is a schematic diagram of a signal time sequence of a phase-locked loop circuit according to an embodiment of the preset invention.

The signal time sequence of the phase-locked loop circuit in the embodiment may be as shown in FIG. 4. In FIG. 4, the count corresponding to the first logic level signal UP is the first number Counter 1; and the count corresponding to the second logic level signal DN is the second number Counter 2.

In one example, the output module U23 may include an adder and a comparator. The adder is configured to calculate the sum of the first number Counter 1 and the second number Counter 2. The comparator is configured to compare the sum of the first number Counter 1 and the second number Counter 2 and the setting value and output the locking signal according to the comparison result.

In this example, the locking signal may be a high-level signal. The comparator may output a low-level signal, that is, not output a locking signal in the case that the sum of the first number Counter 1 and the second number Counter 2 is greater than the setting value, and may output a high-level signal, that is, output the locking signal in the case that the sum of the first number Counter 1 and the second number Counter 2 is less than or equal to the setting value.

In this embodiment, as shown in FIG. 2, the locking detection circuit U2 may further include a rising edge pulse generator U24. The rising edge pulse generator U24 is configured to output a rising edge pulse RST to a reset end RST1 of the first counter U21 and a reset end RST2 of the second counter U22 according to the frequency of the reference clock signal Ref CLK, so that the first counter U21 counts the first number within each period and the second counter U22 counts the second number in each period.

Specifically, the frequency of the rising edge pulse RST generated by the rising edge pulse generator U24 may be identical to that of the reference clock signal Ref CLK, so that outputting the rising edge pulse RST to the reset end RST1 of the first counter U21 and the reset end RST2 of the second counter U22 may ensure that the first number Counter 1 and the second number Counter 2 are both the pulse number of the oscillator clock signal OUT CLK within one period.

In one example, the first logic level signal UP is configured to be input to an enabling end EN1 of the first counter U21, and the second logic level signal DN is configured to be input to an enabling end EN2 of the second counter U22. In this way, it may ensure that the first number Counter 1 is the pulse number of the oscillator clock signal OUT CLK in the case that the first logic level signal UP is valid within one period; and it may ensure that the second number Counter 2 is the pulse number of the oscillator clock signal OUT CLK in the case that the second logic level signal DN is valid within one period.

In one example, the output module U23 is further configured to output the locking signal LOCK when the sum of the first number Counter 1 and the second number Counter 2 is less than or equal to the setting value within the continuous set number of periods of the reference clock signal Ref CLK.

The set number in this embodiment may be set according to the application scene or the specific requirement. For example, the set number may be 2, then the output module U23 may output the locking signal LOCK when the sum of the first number Counter 1 and the second number Counter 2 is less than or equal to the setting value within two continuous periods. In this way, the phase-locked loop circuit may output the locking signal LOCK under the condition that the stable result of the oscillator clock signal OUT CLK is determined to be more accurate.

<Digital Operation System>

The present disclosure further provides a digital operation system. The digital operation system may include the foregoing phase-locked loop circuit and a digital processing circuit. The digital processing circuit is configured to perform digital signal processing according to the oscillator clock signal OUT CLK output by a first output end Out 1 of the phase-locked loop circuit in the case that the locking signal LOCK is output at a second output end Out 2 of the phase-locked loop circuit.

In this embodiment, the digital processing circuit may be a circuit including high-frequency devices. The digital operation system, for example, may be a digital processor chip, a hard disk driver, a memory and a modem.

The above descriptions of the embodiments of the present disclosure are illustrative, not exhaustive, and not restrictive to the disclosed embodiments. It is apparent to those skilled in the art that various modifications and changes may be made without departing from the scope and spirit of the described embodiments. The selection of terms used in the specification is intended to best explain the principle of each embodiment, actual application or technical improvement in the market, or each embodiment which can be understood by other ordinary technicians in the technical field and is disclosed herein. The scope of the present disclosure is defined by the appended claims.

The invention claimed is:

1. A phase-locked loop circuit, comprising a phase-locked loop, a locking detection circuit, an input end adapted for inputting a reference clock signal, a first output end adapted for outputting an oscillator clock signal, and a second output end adapted for outputting a locking signal, wherein the phase-locked loop is configured to output the oscillator clock signal according to the reference clock signal and control the reference clock signal and the oscillator clock signal to be synchronous; and the locking detection circuit is configured to output the locking signal to the second output end when the oscillator clock signal and the reference clock signal are synchronous, wherein the phase-locked loop is a charge pump phase-locked loop, wherein the phase-locked loop comprises a phase detector, a charge pump, a loop filter, a voltage-controlled oscillator and a feedback loop;

the feedback loop is configured to perform frequency modulation processing on the oscillator clock signal to obtain a feedback clock signal, so that a frequency of the feedback clock signal is identical to a frequency of the reference clock signal;

the phase detector is configured to output a first logic level signal and a second logic level signal according to a phase difference between the reference clock signal and the feedback clock signal;

the charge pump is configured to convert the first logic level signal and the second logic level signal into current signals;

the loop filter is configured to convert the current signals into voltage signals; and the voltage-controlled oscillator is configured to output an oscillator clock signal with a corresponding frequency according to the voltage signals, and wherein the locking detection circuit is configured to:

determine whether the oscillator clock signal and the reference clock signal are synchronous according to the reference clock signal, the first logic level signal, the second logic level signal and the oscillator clock signal, and output the locking signal in the case that the oscillator clock signal and the reference clock signal are synchronous.

2. The phase-locked loop circuit according to claim 1, wherein the locking detection circuit comprises a first counter, a second counter and an output module; the first counter is configured to count the pulse number of the oscillator clock signal as a first number in the case that the first logic level signal is valid within one period of the reference clock signal; the second counter is configured to count the pulse number of the oscillator clock signal as a second number in the case that the second logic level signal is valid within one period of the reference clock signal; and the output module is configured to output the locking signal if the sum of the first number and the second number is less than or equal to a preset setting value.

3. The phase-locked loop circuit according to claim 2, wherein the output module is further configured to output the locking signal if the sum of the first number and the second number is less than or equal to the setting value within a continuous set number of periods of the reference clock signal.

4. The phase-locked loop circuit according to claim 2, wherein the output module comprises an adder and a comparator, the adder is configured to calculate the sum of the first number and the second number, and the comparator is configured to compare the sum of the first number and the second number with the setting value to determine a comparison result, and output the locking signal according to the comparison result.

5. The phase-locked loop circuit according to claim 2, wherein the locking detection circuit further comprises a rising edge pulse generator, the rising edge pulse generator is configured to output a rising edge pulse to a reset end of the first counter and a reset end of the second counter according to the frequency of the reference clock signal, so that the first counter counts the first number within each period and the second counter counts the second number within each period.

6. The phase-locked loop circuit according to claim 2, wherein the first logic level signal is configured to be input to an enabling end of the first counter, and the second logic level signal is configured to be input to an enabling end of the second counter.

7. A digital operation system, comprising the phase-locked loop circuit as defined in claim 1; and a digital processing circuit;

wherein the digital processing circuit is configured to perform digital signal processing according to the oscillator clock signal output by a first output end of the phase-locked loop circuit if the locking signal is output at a second output end of the phase-locked loop circuit.

* * * * *